United States Patent
Kubota

(10) Patent No.: US 10,217,612 B2
(45) Date of Patent: Feb. 26, 2019

(54) PLASMA PROCESSING APPARATUS AND PLASMA PROCESSING METHOD WITH A CARRIER WAVE GROUP GENERATING UNIT

(71) Applicant: Tokyo Electron Limited, Tokyo (JP)

(72) Inventor: Shinji Kubota, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/573,156

(22) PCT Filed: May 10, 2016

(86) PCT No.: PCT/JP2016/063926
§ 371 (c)(1),
(2) Date: Nov. 10, 2017

(87) PCT Pub. No.: WO2016/181974
PCT Pub. Date: Nov. 17, 2016

(65) Prior Publication Data
US 2018/0090301 A1    Mar. 29, 2018

(30) Foreign Application Priority Data
May 12, 2015  (JP) .................................. 2015-097520

(51) Int. Cl.
*H01J 37/32*  (2006.01)
*H01L 21/3065*  (2006.01)
*H01L 21/31*  (2006.01)

(52) U.S. Cl.
CPC .... *H01J 37/32302* (2013.01); *H01J 37/3299* (2013.01); *H01J 37/32201* (2013.01); *H01J 37/32293* (2013.01); *H01L 21/3065* (2013.01); *H01L 21/31* (2013.01)

(58) Field of Classification Search
CPC .......... H01J 37/32302; H01J 37/32201; H01J 37/32293; H01J 37/3299
USPC ..................................................... 315/111.21
See application file for complete search history.

(56) References Cited

U.S. PATENT DOCUMENTS

| 2013/0278140 | A1* | 10/2013 | Mudunuri | ................ H05H 1/46 |
| | | | | 315/111.21 |
| 2017/0103874 | A1* | 4/2017 | Kaneko | ............. H01J 37/32935 |
| 2017/0330730 | A1* | 11/2017 | Kubota | ............. H01J 37/32165 |

FOREIGN PATENT DOCUMENTS

| JP | 2000-022661 | A | | 1/2000 |
| JP | 2007-035597 | A | | 2/2007 |
| JP | 2007035597 | A | * | 2/2007 |
| JP | 2011-190479 | A | | 9/2011 |
| JP | 2012-109080 | A | | 6/2012 |

OTHER PUBLICATIONS

International Search Report for PCT/JP2016/063926 dated Jul. 26, 2016.

* cited by examiner

*Primary Examiner* — Dylan C White
(74) *Attorney, Agent, or Firm* — Pearne & Gordon LLP

(57) ABSTRACT

A plasma processing apparatus includes a processing vessel; a carrier wave group generating unit configured to generate a carrier wave group including multiple carrier waves having different frequencies belonging to a preset frequency band centered around a predetermined center frequency; and a plasma generating unit configured to generate plasma within the processing vessel by using the carrier wave group.

12 Claims, 15 Drawing Sheets

PLASMA PROCESSING APPARATUS AND PLASMA PROCESSING METHOD WITH A CARRIER WAVE GROUP GENERATING UNIT

CROSS-REFERENCE TO RELATED APPLICATION

This Application is a U.S. national phase application under 35 U.S.C. § 371 of PCT Application No. PCT/JP2016/063926 filed on May 10, 2016, which claims the benefit of Japanese Patent Application No. 2015-097520 filed on May 12, 2015, the entire disclosures of which are incorporated herein by reference.

TECHNICAL FIELD

The various embodiments described herein pertain generally to a plasma processing apparatus and a plasma processing method.

BACKGROUND ART

There is known a plasma processing apparatus using excitation of a processing gas by a microwave. For example, this plasma processing apparatus generates plasma by radiating the microwave generated by a microwave oscillator into a processing vessel and ionizing the processing gas within the processing vessel.

Further, as a technique for suppressing a deflection of an electric field which occurs within the processing vessel and is caused by a standing wave of the microwave, there is known a technique of generating a microwave having a preset frequency bandwidth by modulating a frequency of a carrier wave.

Patent Document 1: Japanese Patent Laid-open Publication No. 2012-109080

DISCLOSURE OF THE INVENTION

Problems to be Solved by the Invention

In the aforementioned prior art, however, it is yet to be considered to suppress a mode jump and non-uniformity of a plasma density.

In the prior art, the microwave having the preset frequency bandwidth is generated by modulating the frequency of the carrier wave. Here, though a frequency of the microwave generated by the frequency modulation changes within the preset frequency bandwidth with a lapse of time, this microwave exists as a frequency component having a single frequency at a certain time point.

In case of generating the plasma by using the microwave which serves as the frequency component having the single frequency, the microwave is absorbed into the plasma most efficiently when the frequency of the microwave is adjusted to a frequency at which a power of a reflection wave becomes minimum (hereinafter, referred to as "minimum reflection frequency"). However, if the microwave is absorbed with the high efficiency, a plasma density is increased, so that the minimum reflection frequency is then shifted to a higher frequency. Once the minimum reflection frequency is shifted, a power of the microwave absorbed into the plasma is reduced unless the frequency thereof is changed. As a result, the plasma density is decreased. If the plasma density is decreased, the minimum reflection frequency is shifted to a lower frequency. As a result, the power of the microwave absorbed into the plasma is increased, which leads to the increase of the plasma density. In the prior art, as the increase and the decrease of the plasma density are repeated, the non-uniformity of the plasma density would be increased. Besides, in the prior art, there may occur a mode jump which is a phenomenon that the plasma density becomes momentarily discontinuous due to a change in a plasma mode.

Means for Solving the Problems

In an exemplary embodiment, a plasma processing apparatus includes a processing vessel; a carrier wave group generating unit configured to generate a carrier wave group including multiple carrier waves having different frequencies belonging to a preset frequency band centered around a predetermined center frequency; and a plasma generating unit configured to generate plasma within the processing vessel by using the carrier wave group.

Effect of the Invention

According to the exemplary embodiments of the plasma processing apparatus, it is possible to suppress the occurrence of the mode jump and the non-uniformity of the plasma density.

DETAILED DESCRIPTION

Figure 1:
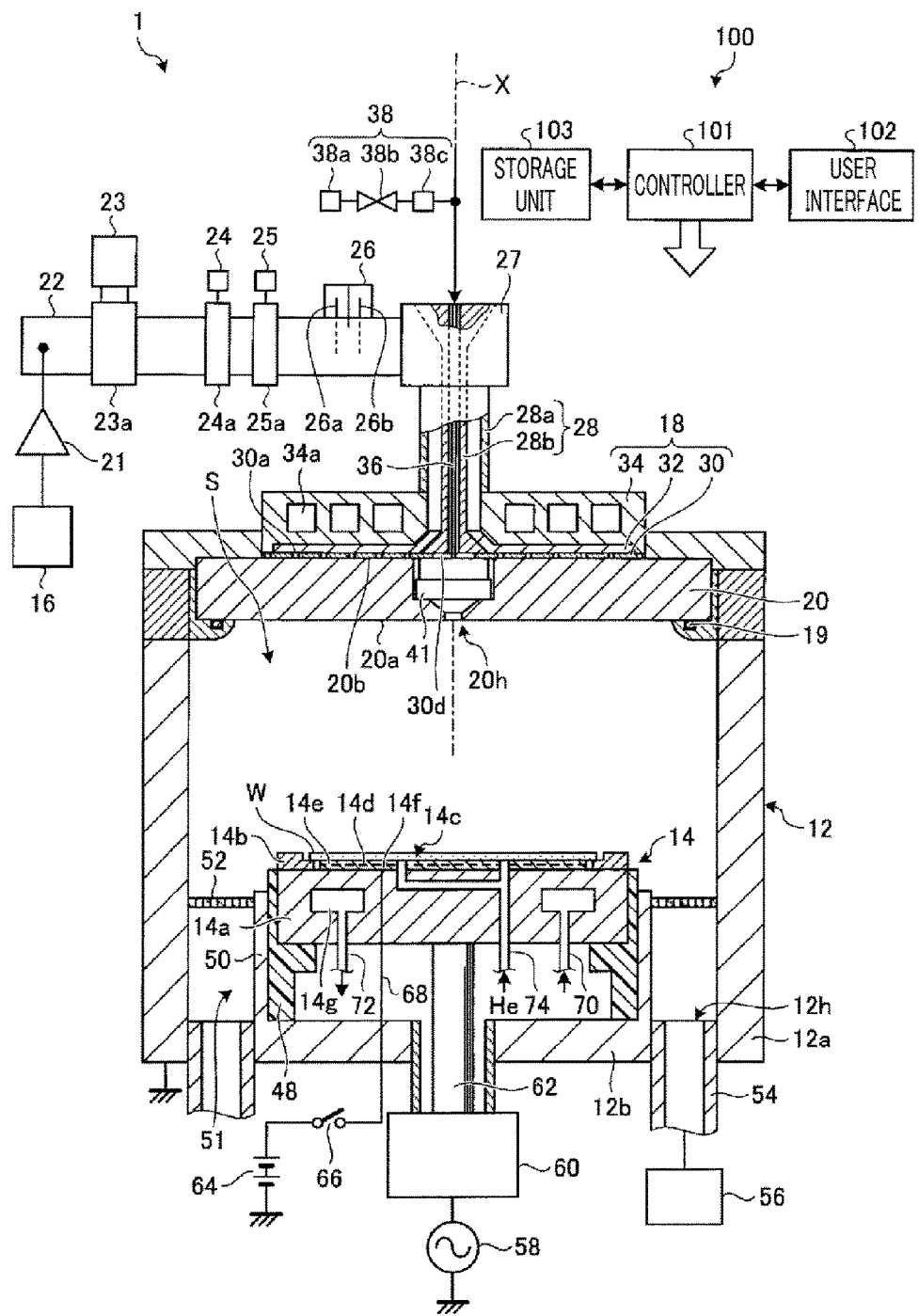
FIG. 1 is a diagram schematically illustrating a plasma processing apparatus according to an exemplary embodiment.

In the following, a plasma processing apparatus according to an exemplary embodiment will be described in detail. In the various drawings, same or corresponding parts will be assigned same reference numerals.

FIG. 1 is a diagram schematically illustrating a plasma processing apparatus according to the exemplary embodiment. A plasma processing apparatus 1 shown in FIG. 1 is equipped with a processing vessel 12, a stage 14, a carrier wave group generating unit 16, an antenna 18, a dielectric window 20 and a control unit 100.

The processing vessel 12 has therein a processing space S for performing a plasma processing therein. The processing vessel 12 has a sidewall 12a and a bottom 12b. The sidewall 12a has a substantially cylindrical shape. Hereinafter, an imaginary axis line X extended at a center of the cylindrical shape of the sidewall 12a is set, and an extension direction of the axis line X is defined as an axis line X direction. The bottom 12b is provided at a lower end of the sidewall 12a and closes a bottom opening of the sidewall 12a. The bottom 12b is provided with an exhaust hole 12h for gas exhaust. An upper end of the sidewall 12a is opened.

An upper end opening of the sidewall 12a is closed by the dielectric window 20. An O-ring 19 is provided between the dielectric window 20 and the upper end of the sidewall 12a. The dielectric window 20 is provided at the upper end of the sidewall 12a with the O-ring 19 therebetween. The O-ring 19 allows the processing vessel 12 to be sealed airtightly. The stage 14 is accommodated in the processing space S, and a processing target object W is placed on the stage 14. The dielectric window 20 has a facing surface 20a which faces the processing space S.

The carrier wave group generating unit 16 is configured to generate a carrier wave group including multiple carrier waves having different frequencies belonging to a preset frequency band centered around a predetermined center frequency. By way of example, the carrier wave group generating unit 16 has a PLL (Phase Locked Loop) oscillator configured to oscillate a microwave having a phase synchronized with a reference frequency; and an IQ digital modulator connected to the PLL oscillator. The carrier wave group generating unit 16 sets a frequency of the microwave oscillated from the PLL oscillator as the center frequency. Further, the carrier wave group generating unit 16 generates the carrier wave group by generating, with the IQ digital modulator, the multiple carrier waves having the different frequencies belonging to the preset frequency band centered around the frequency of the microwave which is set as the center frequency. For example, if inverse Fourier transform is performed on N number of complex data symbols and continuous signals are generated, the carrier wave group of the present disclosure can be generated. This signal generation method may be implemented by the same method as an OFDMA (Orthogonal Frequency-Division Multiple Access) modulation method for use in digital television broadcasting or the like (see, for example, Japanese Patent No. 5,320, 260). Further, the center frequency and the frequency band of the carrier wave group generated by the carrier wave group generating unit 16 are controlled by the control unit 100 to be described later.

Figure 2:
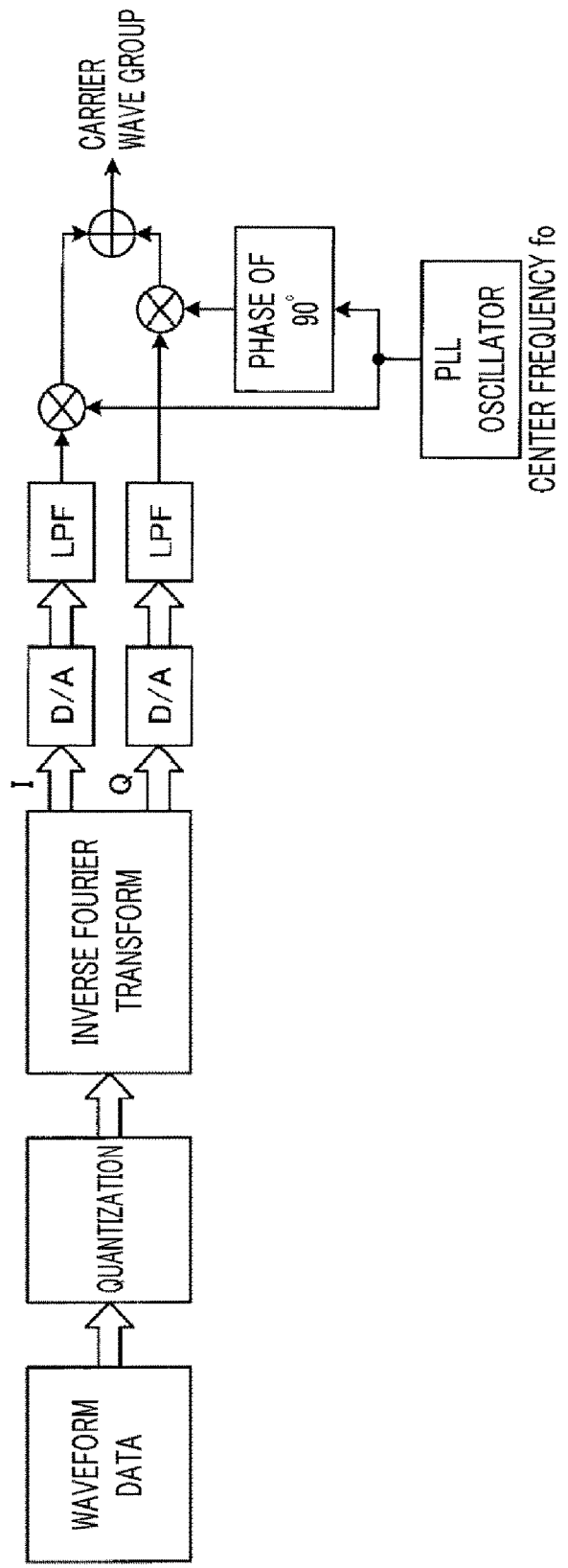
FIG. 2 is a diagram for describing an example of a method of generating a carrier wave group.

FIG. 2 is a diagram for describing an example of a method of generating the carrier wave group. In FIG. 2, waveform data is a sequence of previously digitized codes. Waveform data X(t) at a certain time point t is represented by the following expression (1).

$$X(t) = A(t)\cos(\omega t + \theta_0) \qquad (1)$$

Here, A(t) means an amplitude at the certain time point t, and $\theta_0$ denotes an initial phase.

By developing the expression (1) using addition theorem, the following expression (2) is drawn.

$$X(t) = A(t)\cos \omega t \cdot \cos \theta_0 - A(t)\sin \omega t \cdot \sin \theta_0 \qquad (2)$$

In-phase component data (I data) I(t) of the waveform data X(t) is represented by the following expression (3). Further, quadrature component data (Q data) Q(t) of the waveform data X(t) is represented by the following expression (4).

$$I(t) = A(t)\cos \theta_0 \qquad (3)$$

$$Q(t) = A(t)\cos \theta_0 \qquad (4)$$

The following expression (5) is drawn from the expressions (2) to (4).

$$X(t) = I(t)\cos \omega t - Q(t)\sin \omega t \qquad (5)$$

The above expression (5) implies that all waveform data X(t) can be expressed by using the I data I(t) and the Q data Q(t).

In the carrier wave group generating unit 16, by quantizing the waveform data X(t) and performing inverse Fourier transform thereon, the I data I(t) and the Q data Q(t) are separated. Then, each of the I data I(t) and the Q data Q(t) is D/A (Digital/Analog)-converted and is inputted to a low pass filter (LPF) which allows only a low frequency component to pass therethrough. Meanwhile, two reference carrier waves cos ωt and −sin ωt having a phase difference of 90° are generated from a reference carrier wave (e.g., a microwave) having a center frequency fo generated from the PLL oscillator. Then, by modulating the reference carrier waves cos ωt and −sin ωt having the phase difference of 90° with the I data I(t) and the Q data Q(t) output from the LPF, a carrier wave group is generated. That is, by multiplying the I data I(t) by the reference carrier wave cos ωt and the Q data Q(t) by the reference carrier wave −sin ωt and then by adding the two multiplication results, the carrier wave group is generated. In the present exemplary embodiment, the carrier wave group is obtained by multiplexing a carrier wave with a pitch of 10 kHz and a bandwidth of 40 MHz by using a microwave having a center frequency of 2450 MHz. By setting the phases of neighboring carrier waves to be orthogonal (different by 90°), a large number of closest carrier waves can be arranged.

Figure 3A:
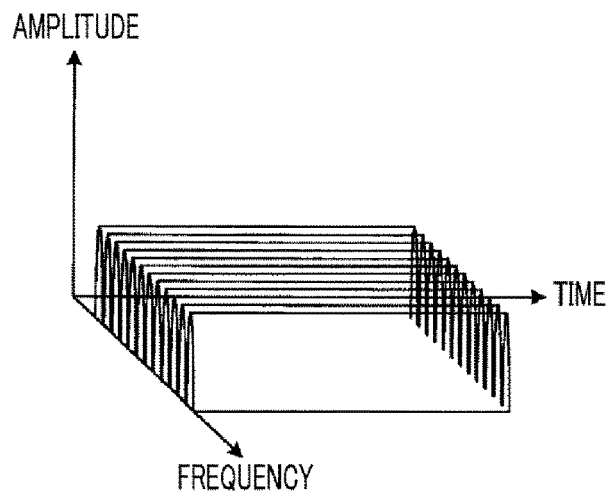
FIG. 3A is a diagram illustrating an example of a waveform of a carrier wave group
Figure 3B:
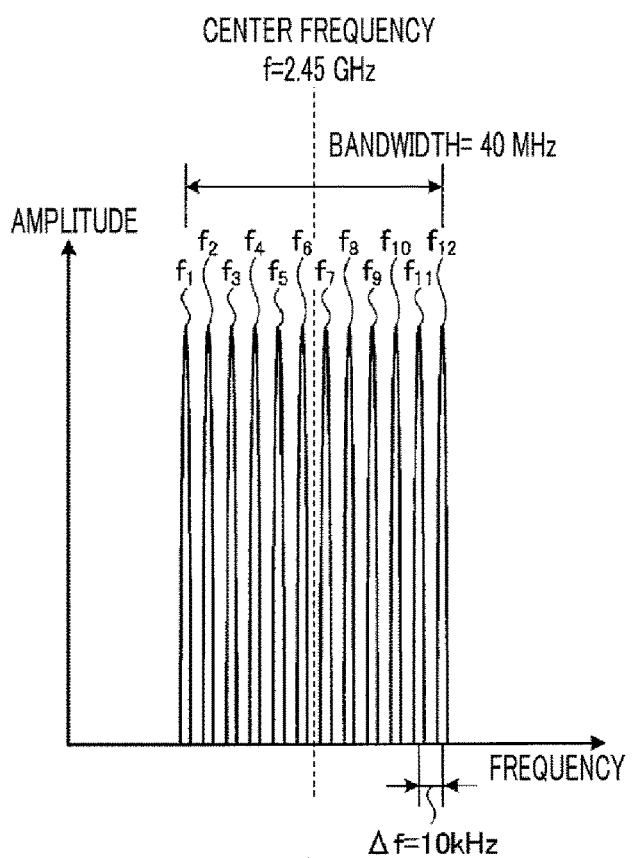
FIG. 3B is a diagram illustrating the example of the waveform of the carrier wave group.
Figure 3C:
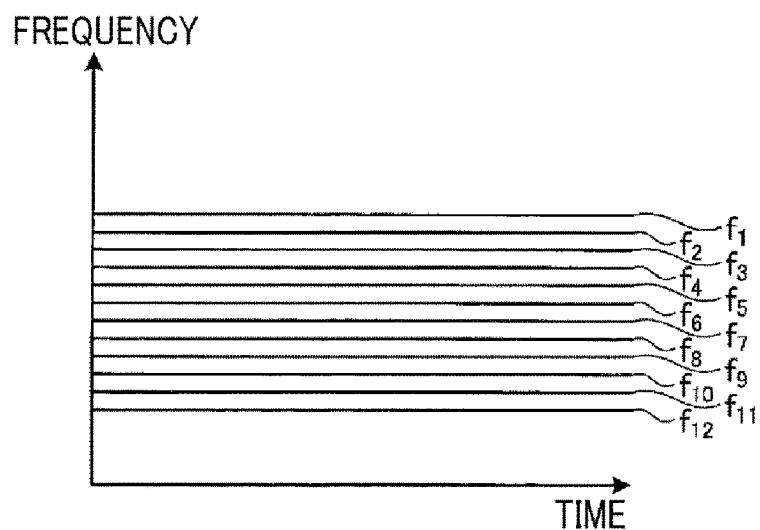
FIG. 3C is a diagram illustrating the example of the waveform of the carrier wave group.
Figure 3D:
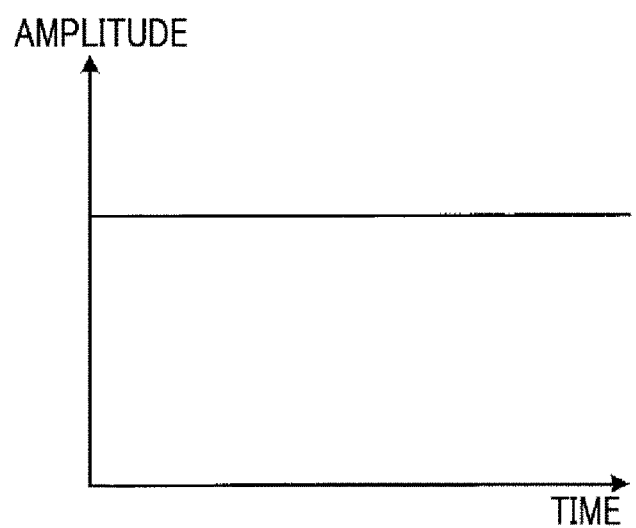
FIG. 3D is a diagram illustrating the example of the waveform of the carrier wave group.

Here, a waveform of the carrier wave group generated by the carrier wave group generating unit 16 will be explained. FIG. 3A to FIG. 3D are diagrams illustrating an example of the waveform of the carrier wave group. FIG. 3A shows the waveform of the carrier wave group in a three-dimensional coordinate space formed by a time axis, a frequency axis and an amplitude axis. FIG. 3B shows the waveform of the carrier wave group in a two-dimensional coordinate space formed by the frequency axis and the amplitude axis. FIG. 3C shows the waveform of the carrier wave group in a two-dimensional coordinate space formed by the time axis and the frequency axis. FIG. 3D shows the waveform of the carrier wave group in a two-dimensional coordinate space formed by the time axis and the amplitude axis.

As depicted in FIG. 3A to FIG. 3D, the carrier wave group is composed of multiple carrier waves $f_1$ to $f_{12}$ having different frequencies belonging to a preset frequency band (e.g., 40 MHz) centered around a predetermined center frequency (e.g., 2.45 GHz). The frequency of each carrier wave is maintained constant regardless of a lapse of time. Further, the multiple carrier waves have the same amplitude. The amplitude of each carrier wave is maintained constant regardless of a lapse of time. Moreover, among the multiple carrier waves, at least two carrier waves having neighboring frequencies in the preset frequency band have a phase difference of 90°. For example, the phases of the carrier wave $f_1$ and the carrier wave $f_2$ having neighboring frequencies may be different by 90°. Furthermore, the frequencies of the multiple carrier waves are arranged at a regular interval (e.g., 10 kHz) within the preset frequency band.

As in the exemplary embodiment, by generating the carrier wave group composed of the multiple carrier waves, a frequency of any one of the multiple carrier waves belonging to the carrier wave group may be allowed to coincide with a frequency at which a power of the reflection wave of the carrier wave group becomes minimum (hereinafter, referred to as "minimum reflection frequency"). As a result, according to the present exemplary embodiment, since a power of the carrier wave group absorbed into plasma can be maintained substantially constant, the non-uniformity of the plasma density can be suppressed.

Figure 4:
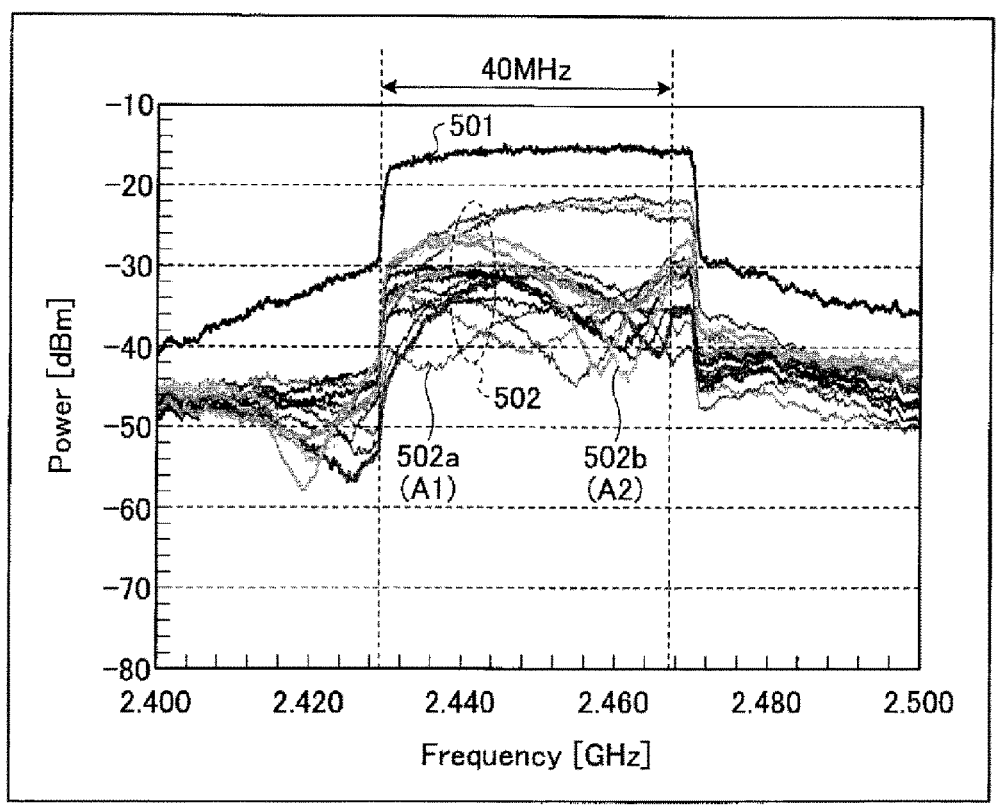
FIG. 4 is a diagram for describing suppression of non-uniformity in a plasma density by the carrier wave group.

FIG. 4 is a diagram for describing suppression of the non-uniformity of the plasma density by the carrier wave group. In FIG. 4, a horizontal axis represents a frequency [GHz], and a vertical axis indicates a power [dBm]. Further, in FIG. 4, a graph 501 shows a frequency spectrum of a progressive wave of the carrier wave group, and a graph group 502 indicates a frequency spectrum of a reflection wave of the carrier wave group. Moreover, in FIG. 4, as experimental conditions, a processing gas and a flow rate are $Cl_2/Ar=100$ sccm/300 sccm, and a pressure is set to be 140 mTorr.

As shown in the graph 501 and the graph group 502 of FIG. 4, in case of generating the carrier wave group having the multiple carrier waves, a frequency of any one of the multiple carrier waves belonging to the carrier wave group coincides with the minimum reflection frequency. Accordingly, the power of the carrier wave group absorbed into plasma is maintained substantially constant. In the example of FIG. 4, the power of the carrier wave group absorbed into the plasma corresponds to an area of a region surrounded by the graph 501 and the graph group 502. Here, an area of a region surrounded by the graph 501 and one graph 502a of the graph group 502 is defined as A1, and an area of a region surrounded by the graph 501 and one graph 502b of the graph group 502 is defined as A2. The areas A1 and A2 are substantially equal, which indicates that the power of the carrier wave group absorbed into the plasma is maintained substantially constant regardless of the change of the minimum reflection frequency. As a result, since the decrease of the plasma density is suppressed, the non-uniformity of the plasma density is also suppressed.

Figure 5:
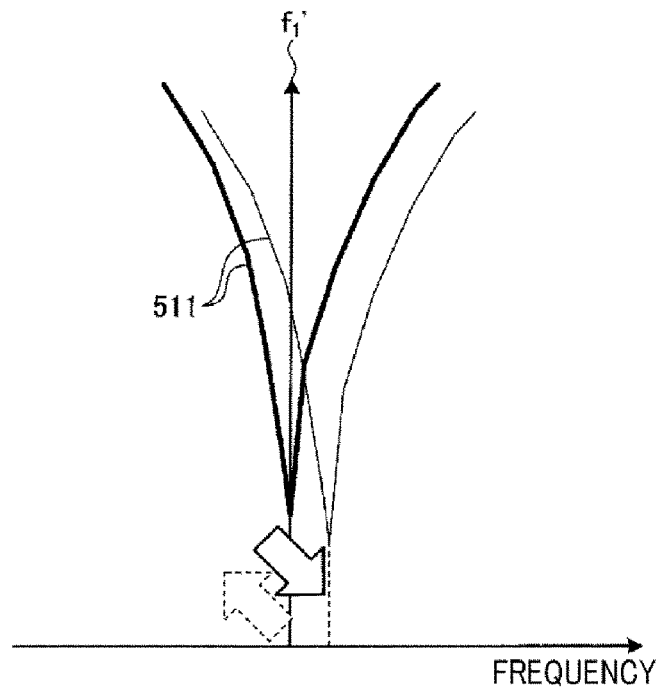
FIG. 5 is a diagram for describing a problem caused when using a microwave having a single frequency.

Here, a mechanism of suppressing the non-uniformity of the plasma density by the carrier wave group according to the present exemplary embodiment will be described in detail. Prior to explaining this mechanism of suppressing the non-uniformity of the plasma density by the carrier wave group according to the present exemplary embodiment, a problem that might be caused when using a microwave having a single frequency will be first explained as a premise. FIG. 5 is a diagram for describing a problem caused when using a microwave having a single frequency. In FIG. 5, a graph 511 shows a portion of a frequency spectrum of a reflection wave of the microwave corresponding to the minimum reflection frequency.

As depicted in FIG. 5, in case of using a microwave $f_1'$ having a single frequency, the single frequency of the microwave $f_1'$ is fixed to coincide with the minimum reflection frequency. If so, the power of the microwave $f_1'$ absorbed into the plasma is increased, which leads to an increase of the plasma density. If the plasma density is increased, the minimum reflection frequency is deviated from the single frequency of the microwave $f_1'$, as indicated by a solid-line arrow of FIG. 5. Accordingly, the reflection wave of the microwave $f_1'$ is increased. If the reflection wave of the microwave $f_1'$ is increased, the power of the microwave $f_1'$ absorbed into the plasma is reduced, which results in a decrease of the plasma density. If the plasma density is decreased, the reflection wave of the microwave $f_1'$ is reduced, so that the minimum reflection frequency gents closer to the single frequency of the microwave $f_1'$, as indicated by a dashed-line arrow of FIG. 5. In such a case, the power of the microwave $f_1'$ absorbed into the plasma is increased, resulting in the increase of the plasma density again. Thus, when using the microwave $f_1'$ having the single frequency, the non-uniformity of the plasma density may be increased as the increase and the decrease of the plasma density are repeated. Furthermore, in case of using a microwave having a preset frequency bandwidth generated by modulating the frequency of the carrier wave, the non-uniformity of the plasma density may also be increased as this microwave has a single frequency at a certain time point.

Figure 6:
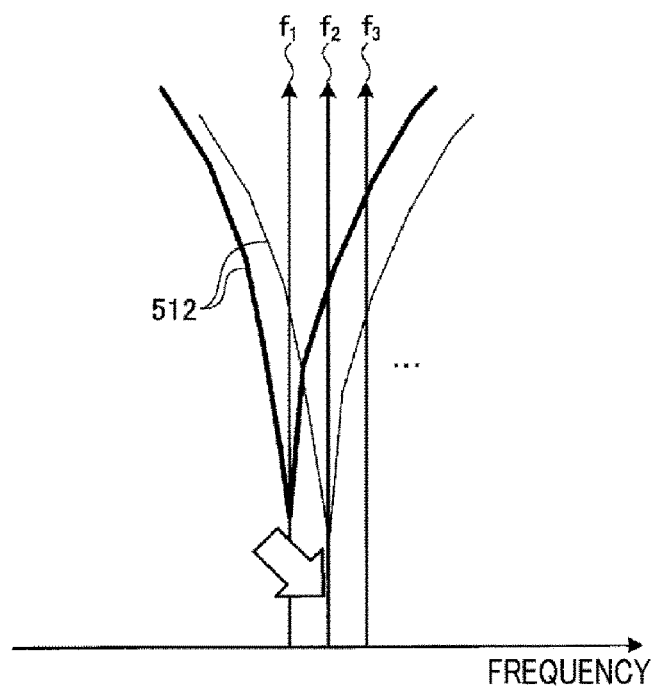
FIG. 6 is a diagram for describing a mechanism of suppressing the non-uniformity in the plasma density by the carrier wave group according to the exemplary embodiment.

Meanwhile, a mechanism of suppressing the non-uniformity of the plasma density by the carrier wave group according to the exemplary embodiment will be discussed. FIG. 6 is a diagram for describing the mechanism of suppressing the non-uniformity of the plasma density by the carrier wave group according to the exemplary embodiment. In FIG. 6, a graph 512 shows a portion of a frequency spectrum of the reflection wave of the carrier wave group corresponding to the minimum reflection frequency.

As shown in FIG. 6, when using a carrier wave group including the multiple carrier waves (carrier waves $f_1$, $f_2$, $f_3$, ... ) having the different frequencies, a frequency of any one of the multiple carrier waves belonging to the carrier wave group coincides with the minimum reflection frequency. In the example of FIG. 6, it is assumed that a frequency of a carrier wave $f_1$ among the multiple carrier waves belonging to the carrier wave group coincides with the minimum reflection wave. If so, a power of the carrier wave $f_1$ absorbed into the plasma is increased, resulting in an increase of the plasma density. If the plasma density increases, the minimum reflection frequency is deviated from the frequency of the carrier wave $f_1$, as shown by a solid-line arrow of FIG. 6. The minimum reflection frequency deviated from the frequency of the carrier wave $f_1$ coincides with a frequency of a carrier wave $f_2$. Accordingly, a power of the carrier wave $f_2$ absorbed into the plasma is increased, which leads to the increase of the plasma density. Thus, if the carrier wave group including the multiple carrier waves having the different frequencies is used, the repetition of the increase and the decrease of the plasma density is avoided. As a result, the non-uniformity of the plasma density is suppressed.

Referring back to FIG. 1, the plasma processing apparatus 1 further includes an amplifier 21, a waveguide 22, a dummy load 23, a detector (progressive wave) 24, a detector (reflection wave) 25, a tuner 26, a mode converter 27 and a coaxial waveguide 28.

The carrier wave group generating unit 16 is connected to the waveguide 22 via the amplifier 21. The amplifier 21 is configured to amplify the carrier wave group generated by the carrier wave group generating unit 16 and output the amplified carrier wave group to the waveguide 22. The waveguide 22 may be, but not limited to, a rectangular waveguide. The waveguide 22 is connected to the mode converter 27, and the mode converter 27 is connected to an upper end of the coaxial waveguide 28.

The dummy load 23 is connected to the waveguide 22 via a circulator 23a. The circulator 23a is configured to extract the reflection wave of the carrier wave group reflected from the processing vessel 12 and output the extracted reflection wave of the carrier wave group to the dummy load 23. The dummy load 23 converts the reflection wave of the carrier wave group input from the circulator 23a to heat by a load or the like.

The detector (progressive wave) 24 is connected to the waveguide 22 via a directional coupler 24a. The directional coupler 24a is configured to extract the progressive wave of the carrier wave group heading toward the processing vessel 12 and output the extracted progressive wave of the carrier wave group to the detector (progressive wave) 24. The detector (progressive wave) 24 is configured to detect the frequency spectrum of the progressive wave of the carrier wave group input from the directional coupler 24a and output the detected frequency spectrum of the progressive wave of the carrier wave group to the control unit 100.

The detector (reflection wave) 25 is connected to the waveguide 22 via a directional coupler 25a. The directional coupler 25a is configured to extract the reflection wave of the carrier wave group reflected from the processing vessel 12 and output the extracted reflection wave of the carrier wave group to the detector (reflection wave) 25. The detector (reflection wave) 25 is configured to detect the frequency spectrum of the reflection wave of the carrier wave group input from the directional coupler 25a and output the detected frequency spectrum of the reflection wave of the carrier wave group to the control unit 100.

The tuner 26 is provided at the waveguide 22 and has a function of matching impedances between the carrier wave group generating unit 16 and the processing vessel 12. The tuner 26 has movable plates 26a and 26b configured to be protrusible into a space within the waveguide 22. The tuner 26 matches the impedance between the carrier wave group generating unit 16 and the processing vessel 12 by controlling protruding positions of the movable plates 26a and 26b with respect to a reference position.

The coaxial waveguide 28 is extended along the axis line X. The coaxial waveguide 28 includes an outer conductor 28a and an inner conductor 28b. The outer conductor 28a has a substantially cylindrical shape extended in the axis line X direction. The inner conductor 28b is provided within the outer conductor 28a. This inner conductor 28b has a substantially cylindrical shape extended along the axis line X.

The carrier wave group generated by the carrier wave group generating unit 16 is transmitted to the mode converter 27 through the tuner 26 and the waveguide 22. The mode converter 27 is configured to convert a mode of the carrier wave group and supply the mode-converted carrier wave group to the coaxial waveguide 28. The carrier wave group from the coaxial waveguide 28 is supplied to the antenna 18.

The antenna 18 is configured to radiate a carrier wave group for plasma excitation based on the carrier wave group generated by the carrier wave group generating unit 16. The antenna 18 has a slot plate 30, a dielectric plate 32 and a cooling jacket 34. The antenna 18 is provided on a surface 20b of the dielectric window 20 opposite from the facing surface 20a, and radiates the carrier wave group for plasma excitation into the processing space S through the dielectric window 20 based on the carrier wave group generated by the carrier wave group generating unit 16.

The slot plate 30 is formed to have a substantially circular plate shape having a plate surface orthogonal to the axis line X. The slot plate 30 is placed on the surface 20b of the dielectric window 20 opposite from the facing surface 20a with the plate surface thereof aligned to that of the dielectric window 20. The slot plate 30 is provided with a multiple number of slots 30a arranged in a circumferential direction with respect to the axis line X. The slot plate 30 is of a type constituting a radial line slot antenna. The slot plate 30 is made of a metal having conductivity and has the substantially circular plate shape. The slot plate 30 is provided with the multiple number of slots 30a. Further, formed at a central portion of the slot plate 30 is a through hole 30d through which a conduction line 36 to be described later can be inserted.

The dielectric plate 32 has a substantially circular plate shape having a plate surface orthogonal to the axis line X. The dielectric plate 32 is provided between the slot plate 30 and a lower surface of the cooling jacket 34. The dielectric plate 32 is made of, by way of non-limiting example, quartz and has the substantially circular plate shape.

A surface of the cooling jacket 34 has conductivity. A flow path 34a through which a coolant flows is provided within the cooling jacket 34. The dielectric plate 32 and the slot plate 30 are cooled by the flow of the coolant. A lower end of the outer conductor 28a is electrically connected to an upper surface of the cooling jacket 34. Further, a lower end of the inner conductor 28b is electrically connected to the slot plate 30 through holes formed at central portions of the cooling jacket 34 and the dielectric plate 32.

The carrier wave group from the coaxial waveguide 28 is propagated to the dielectric plate 32 and then introduced from the slots 30a of the slot plate 30 into the processing space S through the dielectric window 20. In the exemplary embodiment, the conduction line 36 passes through an inner hole of the inner conductor 28b of the coaxial waveguide 28. The through hole 30d is formed at the central portion of the slot plate 30, and the conduction line 36 is inserted through the through hole 30d. The conduction line 36 is extended along the axis line X and is connected to a gas supply system 38.

The gas supply system 38 is configured to supply a processing gas for processing the processing target object W into the conduction line 36. The gas supply system 38 may include a gas source 38a, a valve 38b and a flow rate controller 38c. The gas source 38a is a source of the processing gas. The valve 38b switches a supply and a stop of the supply of the processing gas from the gas source 38a. The flow rate controller 38c may be implemented by, for example, a mass flow controller and is configured to control a flow rate of the processing gas from the gas source 38a. Further, the gas supply system 38 corresponds to an example of a gas supply device configured to introduce the processing gas for use in a plasma reaction into the processing space S.

In the present exemplary embodiment, the plasma processing apparatus 1 is further equipped with an injector 41. The injector 41 is configured to supply the gas from the conduction line 36 into a through hole 20h of the dielectric window 20. The gas supplied into the through hole 20h of the dielectric window 20 is introduced into the processing space S. In the following description, a gas supply path formed by the conduction line 36, the injector 41 and the through hole 20h may sometimes be referred to as "central gas introduction unit".

The stage 14 is provided to face the dielectric window 20 in the axis line X direction. This stage 14 is provided such that the processing space S is formed between the dielectric window 20 and the stage 14. The processing target object W is placed on the stage 14. In the present exemplary embodiment, the stage 14 includes a table 14a, a focus ring 14b and an electrostatic chuck 14c. The stage 14 corresponds to an example of a mounting table.

The table 14a is supported by a cylindrical supporting member 48. The cylindrical supporting member 48 is made of an insulating material and is extended from the bottom 12b vertically upwards. Further, a conductive cylindrical support member 50 is provided on an outer surface of the cylindrical supporting member 48. The cylindrical support member 50 is extended from the bottom 12b of the processing vessel 12 vertically upwards along the outer surface of the cylindrical supporting member 48. An annular exhaust path 51 is formed between the cylindrical support member 50 and the sidewall 12a.

An annular baffle plate 52 having a multiple number of through holes is provided of an upper portion of the exhaust path 51, and an exhaust device 56 is connected to a lower portion of the exhaust hole 12h via an exhaust line 54. The exhaust device 56 has an automatic pressure control valve (APC) and a vacuum pump such as a turbo molecular pump. The processing space S within the processing vessel 12 can be decompressed to a required vacuum level by the exhaust device 56.

The table 14a also serves as a high frequency electrode. The table 14a is electrically connected to a high frequency power supply 58 for a RF bias via a power feed rod 62 and a matching unit 60. The high frequency power supply 58 is configured to output, at a preset power level, a high frequency power (hereinafter, appropriately referred to as "bias power") having a preset frequency of, e.g., 13.65 MHz suitable for controlling energy of ions attracted into the processing target object W. The matching unit 60 incorporates therein a matching device configured to match an impedance of the high frequency power supply 58 and an impedance at a load side thereof such as, mainly, the electrode, the plasma and the processing vessel 12. The matching device includes a blocking capacitor for self-bias generation.

An electrostatic chuck 14c is provided on a top surface of the table 14a. The electrostatic chuck 14c is configured to hold the processing target objet W by an electrostatic attracting force. The focus ring 14b is provided at an outside of the electrostatic chuck 14c in a diametrical direction to surround the processing target object W annularly. The electrostatic chuck 14c includes an electrode 14d, an insulating film 14e and an insulating film 14f. The electrode 14d is made of a conductive film and is embedded between the insulating film 14e and the insulating film 14f. The electrode 14d is electrically connected to a high voltage DC power supply 64 via a switch 66 and a coated line 68. The electrostatic chuck 14c is configured to attract and hold the processing target object W by a Coulomb force generated by a DC voltage applied from the DC power supply 64.

An annular coolant path 14g is provided within the table 14a and is extended in a circumferential direction. A coolant of a preset temperature, for example, cooling water is supplied into and circulated through the coolant path 14g from a chiller unit (not shown) through pipelines 70 and 72. A top surface temperature of the electrostatic chuck 14c is controlled by the temperature of the coolant. Further, a heat transfer gas, for example, a He gas is supplied into a gap between a top surface of the electrostatic chuck 14c and a rear surface of the processing target object W through a gas supply line 74, and a temperature of the processing target object W is controlled based on the top surface temperature of the electrostatic chuck 14c.

In the plasma processing apparatus 1 having the above-described configuration, the gas is introduced through the conduction line 36 and the injector 41 and supplied into the processing space S from the through hole 20h of the dielectric window 20 along the axis line X. Further, the carrier wave group is introduced into the processing space S and/or the through hole 20h from the antenna 18 via the dielectric window 20. Accordingly, the plasma is generated in the processing space S and/or the through hole 20h. Here, the antenna 18 and the dielectric window 20 are an example of a plasma generating unit configured to generate the plasma within the processing vessel 12 by using the carrier wave group.

The control unit 100 is connected to the individual components of the plasma processing apparatus 1 and controls the individual components in an overall manner. The control unit 100 is equipped with a controller 101 having a central processing unit (CPU), a user interface 102 and a storage unit 103.

The controller 101 controls overall operations of the individual components such as the carrier wave group generating unit 16, the stage 14, the gas supply system 38 and the exhaust device 56 by executing a program and a processing recipe stored in the storage unit 103.

The user interface 102 includes a keyboard or a touch panel through which a process manager inputs a command to manage the plasma processing apparatus 1; a display configured to visually display an operational status of the plasma processing apparatus 1; and so forth.

The storage unit 103 has stored thereon control programs (software) for implementing various processings performed in the plasma processing apparatus 1 under the control of the controller 101; processing recipes in which processing condition data are recorded to allow a certain processing to be performed; and so forth. In response to an instruction from the user interface 102 or when necessary, the controller 101 retrieves various control programs from the storage unit 103 and executes the retrieved control programs, so that the required processing is performed in the plasma processing apparatus 1 under the control of the controller 101. The control programs and the recipes such as the processing condition data may be used while being stored in a computer-readable recording medium (e.g., a hard disk, a CD, a flexible disk, a semiconductor memory, etc.), or may be used on-line by being received from another apparatus through, for example, a dedicated line, whenever necessary.

Figure 7:
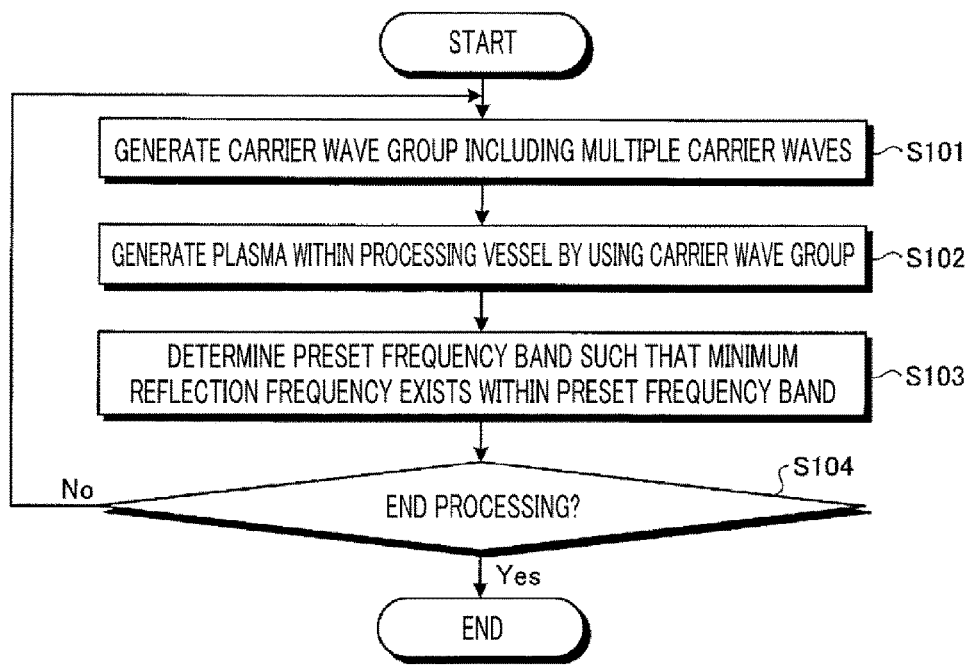
FIG. 7 is a flowchart for describing a plasma processing method according to the exemplary embodiment.

Now, a plasma processing method using the plasma processing apparatus 1 according to the exemplary embodiment will be explained. FIG. 7 is a flowchart for describing the plasma processing method according to the exemplary embodiment.

As depicted in FIG. 7, the carrier wave group generating unit 16 of the plasma processing apparatus 1 generates the carrier wave group including the multiple carrier waves having the different frequencies belonging to the preset frequency band centered around a predetermined center frequency (process S101). Further, initial values of the center frequency and the frequency band of the carrier wave group generated by the carrier wave group generating unit 16 are controlled by the control unit 100.

The antenna 18 and the dielectric window 20 generate the plasma within the processing vessel 12 by using the carrier wave group (process S102).

The control unit 100 receives an input of the frequency spectrum of the reflection wave of the carrier wave group from the detector 25. Then, the control unit 100 determines, by controlling the carrier wave group generating unit 16, a width of the preset frequency band such that the minimum reflection frequency, which refers to the frequency of the reflection wave corresponding to the minimum value of the frequency spectrum, exists within the preset frequency band (process S103).

In case of carrying on the processing (process S104: No), the control unit 100 returns the processing back to the process S101, whereas in case of finishing the processing (process S104: Yes), the control unit 100 ends the processing.

Figure 8:
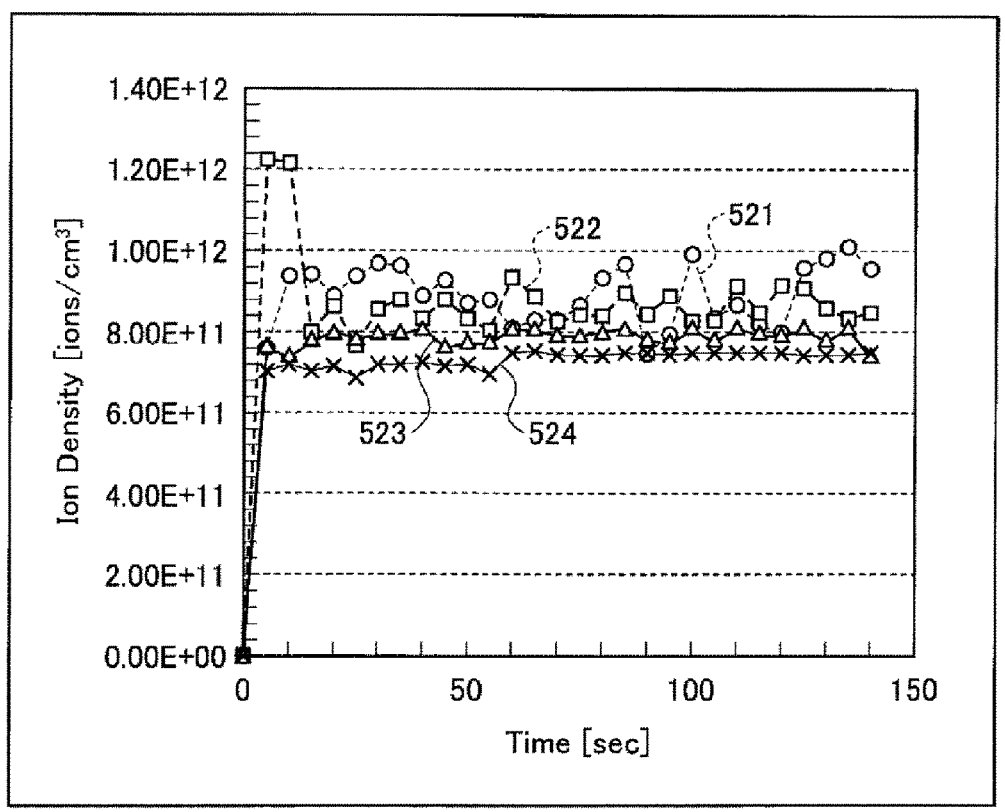
FIG. 8 is a diagram showing a variation of a plasma density when generating plasma by using a carrier wave group or a microwave having a single frequency.

Now, an effect (plasma density) attained by the plasma processing apparatus 1 according to the exemplary embodiment will be discussed. FIG. 8 is a diagram showing a variation of a plasma density when plasma is generated by using a carrier wave group or a microwave having a single frequency. In FIG. 8, a horizontal axis represents a time [sec] and a vertical axis indicates an ion density [ions/cm$^3$] as an example of the plasma density.

Furthermore, in FIG. 8, a graph 521 shows the variation of the plasma density when generating the plasma by using the microwave having the single frequency, and a graph 522 shows the variation of the plasma density when generating the plasma by using the carrier wave group having a preset frequency bandwidth of 10 MHz in the plasma processing apparatus 1 according to the present exemplary embodiment. Further, a graph 523 shows the variation of the plasma density when generating the plasma by using the carrier wave group having a preset frequency bandwidth of 20 MHz in the plasma processing apparatus 1 according to the present exemplary embodiment. A graph 524 shows the variation of the plasma density when generating the plasma by using the carrier wave group having a preset frequency bandwidth of 40 MHz in the plasma processing apparatus 1 according to the present exemplary embodiment. Further, in the example of FIG. 8, as experiment conditions, the processing gas and the flow rate are Ar=100 sccm is used, and the power of the progressive wave of the carrier wave group or the power of the progressive wave of the microwave is set to be 1.4 kW.

As can be seen from FIG. 8, when the plasma is generated by using the carrier wave group, the non-uniformity of the ion density (that is, the plasma density) is suppressed, as compared to the case where the plasma is generated by using the microwave having the single frequency.

Figure 9:
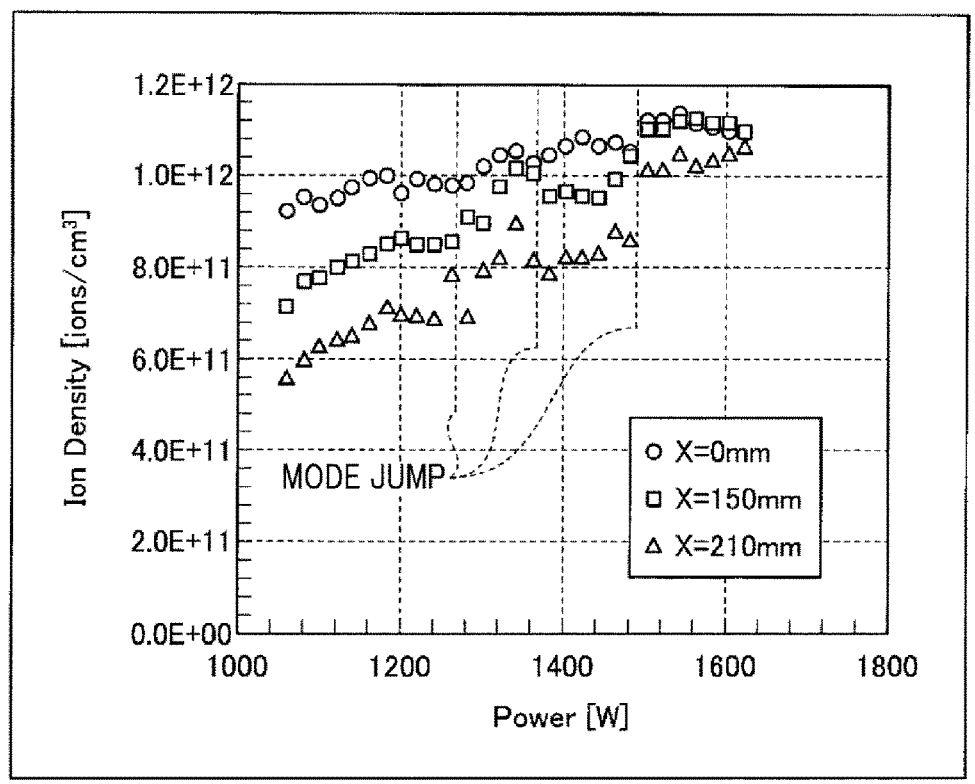
FIG. 9 is a diagram showing a relationship between a plasma density and a power of a progressive wave of a microwave when generating plasma by using a microwave having a single frequency.
Figure 10:
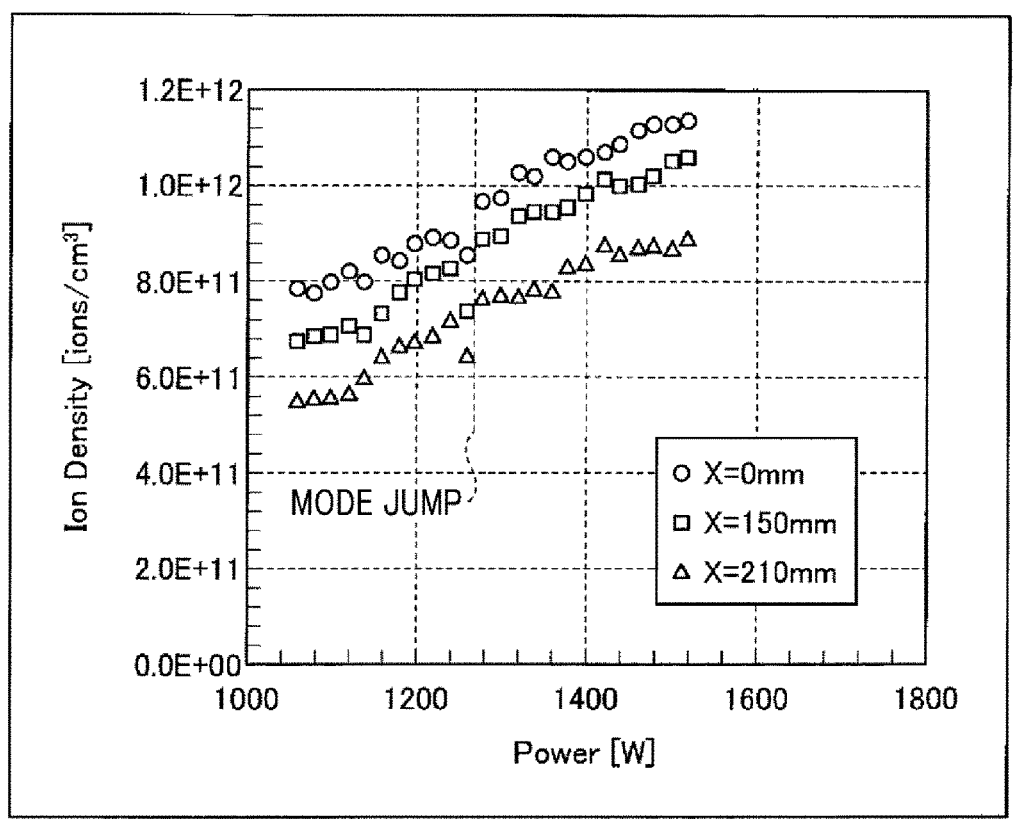
FIG. 10 is a diagram showing a relationship between a plasma density and a power of a progressive wave of a carrier wave group when generating plasma by using the carrier wave group.

Now, an effect (mode jump) achieved by the plasma processing apparatus 1 according to the exemplary embodiment will be discussed. FIG. 9 is a diagram showing a relationship between the plasma density and the power of the progressive wave of the microwave when generating the plasma by using the microwave having the single frequency. FIG. 10 is a diagram showing a relationship between the plasma density and the power of the progressive wave of the carrier wave group when generating the plasma by using the carrier wave group. In FIG. 9 and FIG. 10, a vertical axis represents the ion density [ions/cm$^3$] which is an example of the plasma density. Further, in FIG. 9, a horizontal axis represents the power [W] of the progressive wave of the microwave. In FIG. 10, a horizontal axis indicates the power [W] of the progressive wave of the carrier wave group.

Furthermore, in FIG. 9 and FIG. 10, "X=0 mm" indicates the ion density corresponding to a center position "0" of the processing target object W. Further, "X=150 mm" indicates the ion density corresponding to a position "150 mm" away from the center position "0" of the processing target object W in a diametrical direction of the processing target object W. Further, "X=210 mm" indicates the ion density corresponding to a position "210 mm" away from the center position "0" of the processing target object W in the diametrical direction of the processing target object W.

As can be seen from FIG. 9, in the case of generating the plasma by using the microwave having the single frequency, the mode jump which is a phenomenon that the ion density (i.e., plasma density) becomes momentarily discontinuous is observed at three powers of the progressive wave of the microwave.

In contrast, as shown in FIG. 10, in the case of generating the plasma by using the carrier wave group, the mode jump which is the phenomenon that the ion density (i.e., plasma density) becomes momentarily discontinuous is observed at a single power of the progressive wave of the carrier wave group microwave. That is, as compared to the case of generating the plasma by using the microwave having the single frequency, occurrence of the mode jump is suppressed when generating the plasma by using the carrier wave group.

Figure 11A:
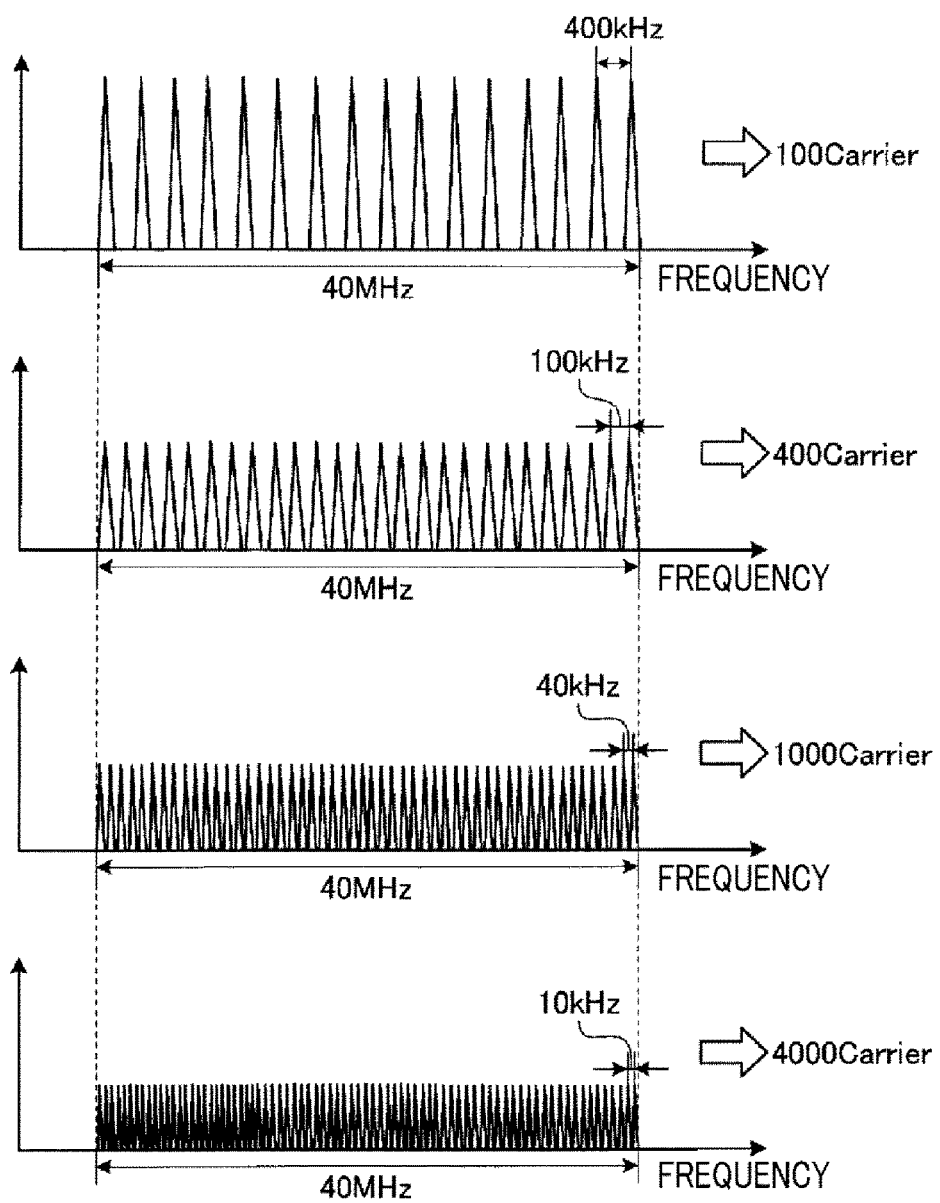
FIG. 11A is a diagram illustrating an example of a relationship between a carrier wave pitch and a number of multiple carrier waves belonging to the carrier wave group.

Now, an effect (stability of plasma) obtained by the plasma processing apparatus 1 according to the present exemplary embodiment will be explained. In the following, referring to FIG. 11A to FIG. 11C, an experiment result showing an example of a relationship between an interval of frequencies of the multiple carrier waves belonging to the carrier wave group (hereinafter, referred to as "carrier wave pitch") and stability of the plasma will be explained. FIG. 11A is a diagram showing an example of a relationship between the carrier wave pitch and a number of the multiple carrier waves belonging to the carrier wave group. In FIG. 11A, the power of the carrier wave group, that is, a sum of powers of the individual carrier waves belonging to the carrier wave group is set to be constant. Furthermore, in FIG. 11A, the carrier wave group exists within the frequency band of 40 MHz centered around the center frequency of 2450 MHz.

As depicted in FIG. 11A, as the carrier wave pitch gets smaller, the number of the carrier waves belonging to the carrier wave group increases. For example, when the carrier wave pitch is 400 kHz, 100 kHz, 40 kHz and 10 kHz, the number of the carrier waves belonging to the carrier wave group is 100, 400, 1000 and 4000, respectively.

Figure 11B:
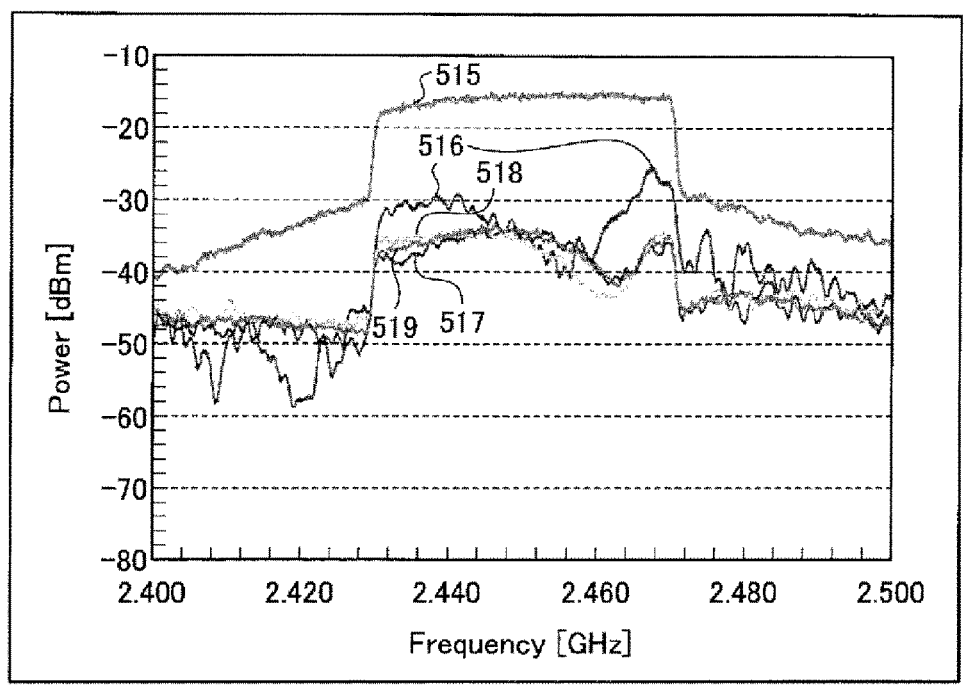
FIG. 11B is a diagram illustrating a variation of a power of the carrier wave group absorbed into plasma in relation to a variation of the carrier wave pitch.

FIG. 11B is a diagram for describing the variation of the power of the carrier wave group absorbed into the plasma in relation to the variation of the carrier wave pitch. In FIG. 11B, a horizontal axis represents the frequency [GHz] and a vertical axis represents the power [dBm]. Further, in FIG. 11B, a graph 515 indicates the frequency spectrum of the progressive wave of the carrier wave group. A graph 516 shows the frequency spectrum of the reflection wave of the carrier wave group when the carrier wave pitch is 400 kHz. Further, a graph 517 shows the frequency spectrum of the reflection wave of the carrier wave group when the carrier wave pitch is 100 kHz. A graph 518 shows the frequency spectrum of the reflection wave of the carrier wave group when the carrier wave pitch is 40 kHz. A graph 519 indicates the frequency spectrum of the reflection wave of the carrier wave group when the carrier wave pitch is 10 kHz. Furthermore, in FIG. 11B, as processing conditions, the processing gas of $Cl_2$ and Ar respectively having flow rates of 100 sccm and 300 sccm is used, and a pressure is set to be 140 mTorr; the center frequency, 2.450 GHz; the frequency band, 40 MHz; and an input power of the progressive wave of the carrier wave group, 1.5 kW.

As can be seen from FIG. 11B, when the carrier wave pitch is equal to or less than 100 kHz, an area of a region surrounded by the graph 515 and the graph 517, 518 or 519, that is, a power of the carrier wave group absorbed into the plasma is maintained substantially constant.

Figure 11C:
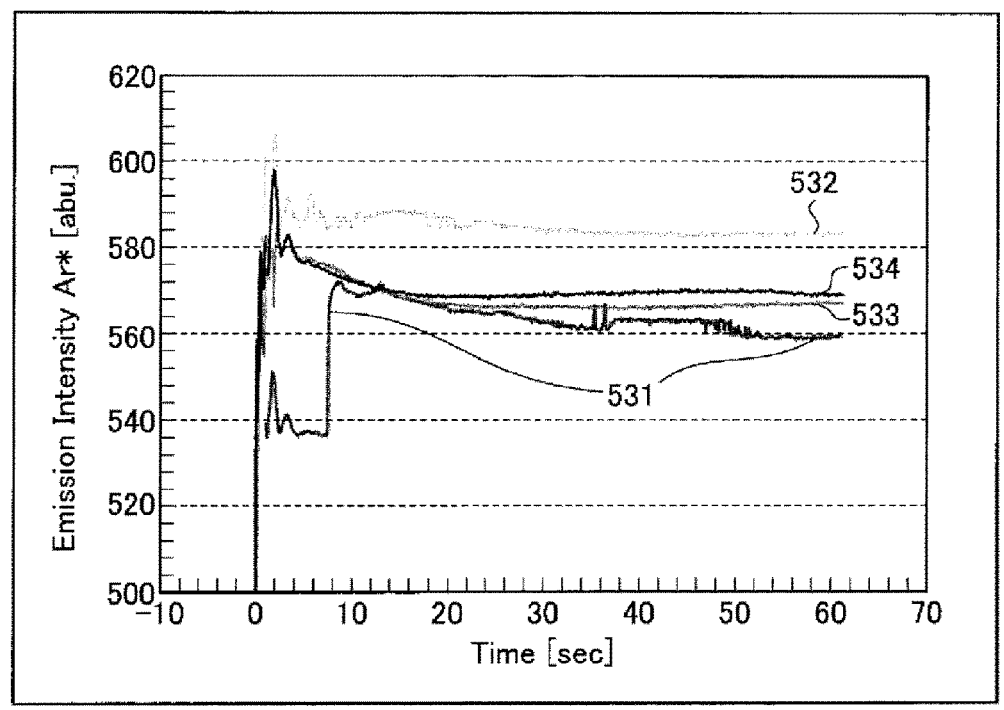
FIG. 11C is a diagram showing an example of a relationship between a carrier wave pitch and an emission intensity of the plasma.

FIG. 11C is a diagram showing an example of a relationship between the carrier wave pitch and the emission intensity of the plasma. FIG. 11C shows an experiment result of investigating a variation in the emission intensity of the plasma with a lapse of time to evaluate the stability of the plasma. In FIG. 11C, a horizontal axis represents the time [sec] and a vertical axis represents the emission intensity [abu.] of the plasma. In FIG. 11C, a graph 531 shows the variation of the emission intensity of the plasma generated by using the carrier wave group having the carrier wave pitch of 400 kHz. A graph 532 shows the variation of the emission intensity of the plasma generated by using the carrier wave group having the carrier wave pitch of 100 kHz. A graph 533 shows the variation of the emission intensity of the plasma generated by using the carrier wave group having the carrier wave pitch of 40 kHz. A graph 534 shows the variation of the emission intensity of the plasma generated by using the carrier wave group having the carrier wave pitch of 10 kHz.

As can be clearly seen from the experiment result of FIG. 11C, as the carrier wave pitch is reduced, the variation of the emission intensity of the plasma over time is suppressed. That is, by setting the carrier wave pitch to be small, the stability of the plasma can be improved.

As stated above, in the plasma processing apparatus 1 according to the present exemplary embodiment, since the carrier wave group including the multiple carrier waves is generated and the plasma is generated by using the carrier wave group, the repetition of the increase and the decrease of the plasma density can be avoided. As a result, the non-uniformity of the plasma density and the occurrence of a mode jump can be suppressed.

Furthermore, in the plasma processing apparatus 1 according to the present exemplary embodiment, the width of the preset frequency band is set such that the minimum reflection frequency exists within the preset frequency band of the carrier wave group. As a consequence, the possibility that the minimum reflection frequency coincides with the frequency of any one reflection wave among the reflection waves belonging to the carrier wave group can be increased, so that non-uniformity of the plasma density and the occurrence of the mode jump can be further suppressed.

Modification Example 1

Now, a modification example 1 will be explained. A plasma processing apparatus according to the modification example 1 has the same configuration as that of the plasma processing apparatus 1 according to the above-described exemplary embodiment except that another carrier wave group different from the above-described carrier wave group is generated prior to performing the plasma processing. Thus, in the modification example 1, the same components as those of the above-described exemplary embodiment will be assigned same reference numerals, and detailed description thereof will be omitted.

In the plasma processing apparatus according to the modification example 1, the carrier wave group generating unit 16 generates an additional carrier wave group prior to performing the plasma processing on the processing target object by the plasma which is generated by using the carrier wave group. Like the carrier wave group (hereinafter, referred to as "carrier wave group for plasma processing") for use in the plasma processing, this additional carrier wave group includes multiple carrier waves having different frequencies belonging to a preset frequency band centered around a predetermined center frequency. An amplitude of each of the carrier waves belonging to this additional carrier wave group varies with a lapse of time, and a maximum value of this amplitude is larger than the amplitude of each carrier wave belonging to the carrier wave group for plasma processing.

The antenna 18 and the dielectric window 20 generate plasma within the processing vessel 12 by using this additional carrier wave group. This additional carrier wave group is used for ignition of the plasma.

Figure 12:
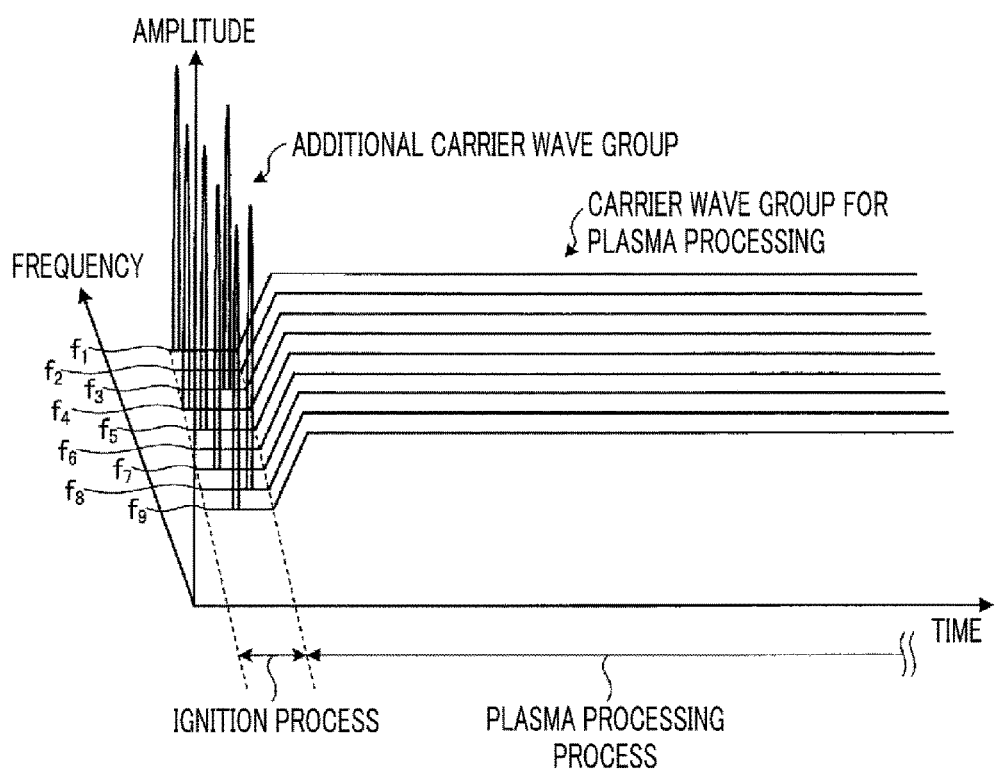
FIG. 12 is a diagram showing an example of a waveform of another carrier wave group.

Here, a waveform of the additional carrier wave group generated by the carrier wave group generating unit 16 will be explained. FIG. 12 is a diagram illustrating an example of the waveform of the additional carrier wave group. FIG. 12 shows the waveform of the additional carrier wave group in the three-dimensional coordinate space formed by the time axis, the frequency axis and the amplitude axis.

As depicted in FIG. 12, the additional carrier wave group includes multiple carrier waves $f_1$ to $f_9$ having different frequencies belonging to the preset frequency band (e.g., 40 MHz) centered around the predetermined center frequency (e.g., 2.45 GHz). An amplitude of each carrier wave belonging to this additional carrier wave group varies with a lapse of time, and a maximum value of this amplitude is larger than the amplitude of each carrier wave belonging to the carrier wave group for plasma processing. In the example of FIG. 12, the amplitudes of the carrier waves $f_1$ to $f_9$ reach their maximum values at different time points within a processing time of an ignition process. Further, the maximum values of the amplitudes of the carrier waves f1 to f9 are larger than the amplitude of each carrier wave belonging to the carrier wave group for plasma processing.

In the plasma processing apparatus according to the modification example 1, the additional carrier wave group including the multiple carrier waves is generated prior to performing the plasma processing, and the plasma is generated by using this additional carrier wave group. Therefore, the ignition of the plasma can be performed stably.

Modification Example 2

Now, a modification example 2 will be explained. A plasma processing apparatus according to the modification example 2 has the same configuration as that of the plasma processing apparatus 1 according to the above-described exemplary embodiment except that at least one of the multiple carrier waves belonging to the carrier wave group is generated prior to performing the plasma processing. Thus, in the modification example 2, the same components as those of the above-described exemplary embodiment will be assigned same reference numerals, and detailed description thereof will be omitted.

In the plasma processing apparatus according to the modification example 2, the carrier wave group generating unit 16 generates at least one of the multiple carrier waves belonging to the carrier wave group prior to performing the plasma processing on the processing target object by the plasma generated by using the carrier wave group.

The antenna 18 and the dielectric window 20 generate the plasma within the processing vessel 12 by using the at least one carrier wave generated. This at least one carrier wave is used for ignition of the plasma.

Figure 13:
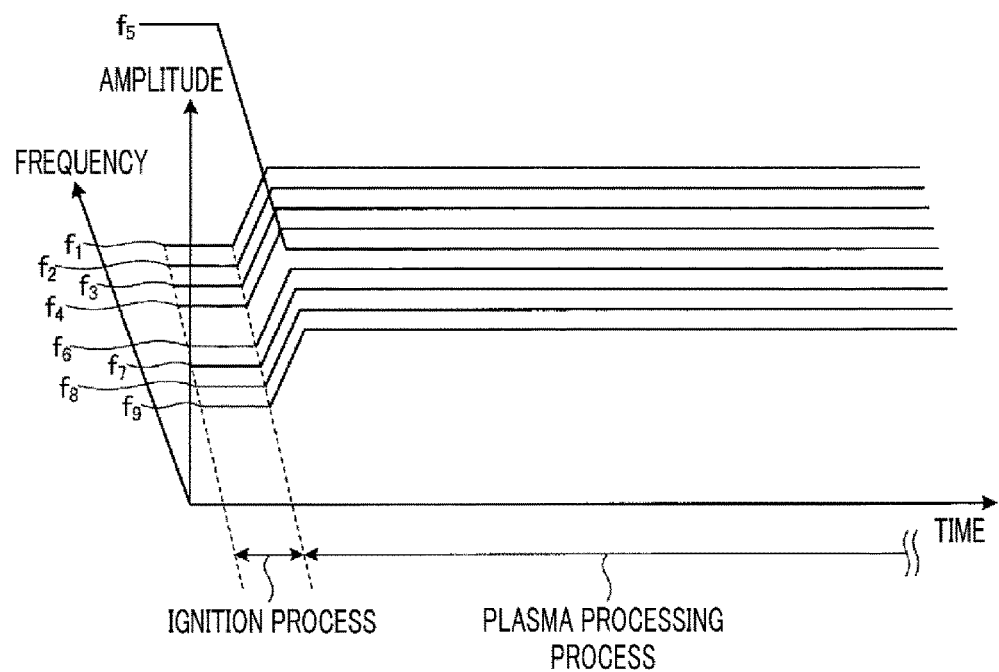
FIG. 13 is a diagram showing an example of a waveform of at least one carrier wave.

Here, a waveform of the at least one carrier wave generated by the carrier wave group generating unit 16 will be explained. FIG. 13 is a diagram illustrating an example of the waveform of the at least one carrier wave. FIG. 13 shows the waveform of another carrier wave group in the three-dimensional coordinate space formed by the time axis, the frequency axis and the amplitude axis.

As depicted in FIG. 13, an amplitude of at least one carrier wave $f_5$ is larger than an amplitude of the carrier wave $f_5$ for a time during which the plasma processing is performed.

In the plasma processing apparatus according to the modification example 2, the at least one carrier wave among the multiple carrier waves belonging to the carrier wave group is generated before the plasma processing is performed, and the plasma is generated by using the at least one carrier wave. Therefore, the ignition of the plasma can be performed stably.

Furthermore, the exemplary embodiment has been described for the example case of using the microwave. However, the same effects can be achieved when using high frequency plasma of 13.56 MHz and VHF plasma of 100 MHz as well. That is, the exemplary embodiment is not merely limited to using the microwave.

EXPLANATION OF REFERENCE NUMERALS

1: Plasma processing apparatus
12: Processing vessel
14: Stage
16: Carrier wave group generating unit
18: Antenna
20: Dielectric window
30: Slot plate
38: Gas supply system
100: Control unit
101: Controller
102: User interface
103: Storage unit

We claim:

1. A plasma processing apparatus, comprising:
a processing vessel;
a carrier wave group generating unit configured to generate a carrier wave group including multiple carrier waves having different frequencies belonging to a preset frequency band centered around a predetermined center frequency; and
a plasma generating unit configured to generate plasma within the processing vessel by using the carrier wave group,
wherein a number of the multiple carrier waves belonging to the carrier wave group is 400 or more.

2. The plasma processing apparatus of claim 1,
wherein the frequencies of the multiple carrier waves are arranged at a regular interval.

3. The plasma processing apparatus of claim 1,
wherein the carrier wave group is generated by modulating carrier waves having a phase difference of 90° with I data and Q data obtained by quantizing waveform data and performing inverse Fourier transform thereon.

4. The plasma processing apparatus of claim 1,
wherein the frequencies of the multiple carrier waves are maintained constant regardless of a lapse of time.

5. The plasma processing apparatus of claim 1,
wherein the multiple carrier waves have a same amplitude.

6. The plasma processing apparatus of claim 1,
wherein, among the multiple carrier waves, at least two carrier waves having neighboring frequencies in the preset frequency band have different phases.

7. The plasma processing apparatus of claim 1,
wherein, among the multiple carrier waves, at least two carrier waves having neighboring frequencies in the preset frequency band have a phase difference of 90°.

8. The plasma processing apparatus of claim 1,
wherein the carrier wave group generating unit generates an additional carrier wave group including multiple carrier waves having different frequencies belonging to the present frequency band centered around the predetermined center frequency prior to performing a plasma processing on a processing target object by the plasma,
the plasma generating unit generates the plasma within the processing vessel by using the additional carrier wave group, and
an amplitude of each of the multiple carrier waves belonging to the additional carrier wave group varies with a lapse of time, and a maximum value of the amplitude of each of the multiple carrier waves belonging to the additional carrier wave group is larger than an amplitude of each of the multiple carrier waves belonging to the carrier wave group.

9. The plasma processing apparatus of claim 1,
wherein the carrier wave group generating unit generates at least one carrier wave among the multiple carrier waves belonging to the carrier wave group prior to performing a plasma processing on a processing target object by the plasma,
the plasma generating unit generates the plasma within the processing vessel by using the at least one carrier wave, and
an amplitude of the at least one carrier wave is larger than an amplitude of the at least one carrier wave for a time during which the plasma processing is performed.

10. A plasma processing apparatus, comprising:
a processing vessel;
a carrier wave group generating unit configured to generate a carrier wave group including multiple carrier waves having different frequencies belonging to a preset frequency band centered around a predetermined center frequency; and
a plasma generating unit configured to generate plasma within the processing vessel by using the carrier wave group, wherein the amplitude of each of the multiple carrier waves is maintained constant regardless of a lapse of time.

11. A plasma processing apparatus, comprising:
a processing vessel;
a carrier wave group generating unit configured to generate a carrier wave group including multiple carrier waves having different frequencies belonging to a preset frequency band centered around a predetermined center frequency;

a plasma generating unit configured to generate plasma within the processing vessel by using the carrier wave group; a detector configured to detect a frequency spectrum of a reflection wave of the carrier wave group; and a control unit configured to determine a width of the present frequency band by controlling the carrier wave group generating unit such that a minimum reflection frequency, which is a frequency of the reflection wave corresponding to a minimum value of the frequency spectrum, exists within the preset frequency band.

12. A plasma processing method, comprising:

generating a carrier wave group including multiple carrier waves having different frequencies belonging to a preset frequency band centered around a predetermined center frequency; and generating plasma within a processing vessel by using the carrier wave group, wherein a number of the multiple carrier waves belonging to the carrier wave group is 400 or more.

* * * * *

UNITED STATES PATENT AND TRADEMARK OFFICE
CERTIFICATE OF CORRECTION

PATENT NO. : 10,217,612 B2
APPLICATION NO. : 15/573156
DATED : February 26, 2019
INVENTOR(S) : Shinji Kubota Page 1 of 1

It is certified that error appears in the above-identified patent and that said Letters Patent is hereby corrected as shown below:

In the Specification

Column 12, Line 33, "group microwave." should be -- group. --.

Signed and Sealed this
Twenty-first Day of May, 2019

Andrei Iancu
*Director of the United States Patent and Trademark Office*